United States Patent
Suga et al.

(10) Patent No.: US 12,272,929 B2
(45) Date of Patent: Apr. 8, 2025

(54) OPTICAL SEMICONDUCTOR DEVICE

(71) Applicant: Lumentum Japan, Inc., Sagamihara (JP)

(72) Inventors: Kazuki Suga, Sagamihara (JP); Kouji Nakahara, Tokyo (JP)

(73) Assignee: Lumentum Japan, Inc., Kanagawa (JP)

( * ) Notice: Subject to any disclaimer, the term of this patent is extended or adjusted under 35 U.S.C. 154(b) by 53 days.

(21) Appl. No.: 17/216,229

(22) Filed: Mar. 29, 2021

(65) Prior Publication Data

US 2022/0085574 A1    Mar. 17, 2022

(30) Foreign Application Priority Data

Sep. 14, 2020  (JP) .................................. 2020-153686
Nov. 12, 2020  (JP) .................................. 2020-188541

(51) Int. Cl.
*H01S 5/20*  (2006.01)
*H01S 5/12*  (2021.01)
(Continued)

(52) U.S. Cl.
CPC .......... *H01S 5/2054* (2013.01); *H01S 5/1237* (2013.01); *H01S 5/2031* (2013.01); *H01S 5/2206* (2013.01); *H01S 5/227* (2013.01); *H01S 5/3213* (2013.01); *H01S 5/3403* (2013.01); *H01S 5/3407* (2013.01); *H01S 5/34313* (2013.01); *H01S 5/06226* (2013.01)

(58) Field of Classification Search
CPC .. H01S 5/2031; H01S 5/06226; H01S 5/3407; H01S 5/3211; H01S 5/3213
See application file for complete search history.

(56) References Cited

U.S. PATENT DOCUMENTS 5,642,371 A  *  6/1997  Tohyama ............... B82Y 20/00
                                                      372/50.1
6,434,178 B1 *  8/2002  Ubukata ................ B82Y 20/00
                                                      372/45.01
(Continued)

FOREIGN PATENT DOCUMENTS

JP    H0799366 A    4/1995
JP    H07183617 A   7/1995
(Continued)

*Primary Examiner* — Tod T Van Roy
(74) *Attorney, Agent, or Firm* — Harrity & Harrity, LLP

(57) ABSTRACT

An optical semiconductor device includes a multi-quantum well layer including well layers and barrier layers alternately overlapping with each other, an optical confinement layer, and a guide layer interposed between the multi-quantum well layer and the optical confinement layer. Each barrier layer is an undoped layer and an outermost layer is one of the barrier layers. The optical confinement layer has a refractive index that is greater than that of the outermost layer and a band gap that is smaller than that of the outermost layer. The guide layer includes a first adjacent layer in contact with the outermost layer and the guide layer is thinner than the optical confinement layer. Each of the optical confinement layer and the guide layer is an n-type semiconductor layer. The first adjacent layer of the guide layer has a band gap that is larger than that of the optical confinement layer.

25 Claims, 9 Drawing Sheets

(51) Int. Cl.
*H01S 5/22* (2006.01)
*H01S 5/227* (2006.01)
*H01S 5/32* (2006.01)
*H01S 5/34* (2006.01)
*H01S 5/343* (2006.01)
*H01S 5/062* (2006.01)

(56) References Cited

U.S. PATENT DOCUMENTS

| | | | | |
|---|---|---|---|---|
| 6,606,334 | B1* | 8/2003 | Shigihara | H01S 5/223 |
| | | | | 372/45.01 |
| 7,724,795 | B2* | 5/2010 | Son | H01S 5/34333 |
| | | | | 372/45.01 |
| 7,949,026 | B2* | 5/2011 | Kyono | B82Y 20/00 |
| | | | | 372/39 |
| 8,242,522 | B1 | 8/2012 | Raring | |
| 8,472,490 | B2* | 6/2013 | Sakaino | H01S 5/2222 |
| | | | | 372/43.01 |
| 10,985,533 | B2* | 4/2021 | Nakatani | H01S 5/34353 |
| 2003/0210720 | A1* | 11/2003 | Reid | H01S 5/22 |
| | | | | 372/46.01 |
| 2005/0100066 | A1* | 5/2005 | Reid | B82Y 20/00 |
| | | | | 372/45.01 |
| 2018/0090910 | A1* | 3/2018 | Nakahara | H01S 5/343 |
| 2022/0085574 | A1* | 3/2022 | Suga | H01S 5/2206 |
| 2023/0021325 | A1* | 1/2023 | Takayama | H01S 5/309 |

FOREIGN PATENT DOCUMENTS

| | | | | |
|---|---|---|---|---|
| JP | H11274644 | A | 10/1999 | |
| JP | 2000174394 | A | 6/2000 | |
| JP | 2007208062 | A | 8/2007 | |
| JP | 2008103721 | A | 5/2008 | |
| JP | 2009200437 | A | 9/2009 | |
| JP | 2018056212 | A | 4/2018 | |
| WO | WO-2020022116 | A1 * | 1/2020 | H01S 5/0206 |

* cited by examiner

OPTICAL SEMICONDUCTOR DEVICE

CROSS-REFERENCE TO RELATED APPLICATIONS

The present application claims priority from Japanese patent applications JP2020-153686 filed on Sep. 14, 2020 and JP2020-188541 filed on Nov. 12, 2020, the contents of which are hereby expressly incorporated by reference herein.

TECHNICAL FIELD

The disclosure relates to an optical semiconductor device.

BACKGROUND

Typically, an optical semiconductor device for optical communication may have a multi-quantum well layer as an active layer. A separate confinement heterostructure (SCH), in which carriers and light are separately confined, interposes the multi-quantum well layer between SCH layers. In some cases, to satisfy high speed requirements, an optical confinement factor of the multi-quantum well layer may need to be increased and a relaxation oscillation frequency (fr) may need to be increased to improve an f3 dB bandwidth of the optical semiconductor device (e.g., as compared to a conventional optical semiconductor device).

An increase in a refractive index of the multi-quantum well layer can further increase the optical confinement factor of the multi-quantum well layer, which affects other characteristics, such as optical output characteristics and gain characteristics. Alternatively, an increase in a refractive index of a SCH layer can increase the optical confinement factor, due to an increase in an optical confinement factor of a region that includes upper and lower SCH layers. However, an energy barrier forms between an SCH layer and a multi-quantum well layer (barrier layer). In some cases, a greater impact is put on a side of an n-type SCH layer and thereby electrons are stagnated by the energy barrier, which impedes a flow of the electrons at low frequencies.

In some cases, electron stagnation can be used to increase carrier capture time and/or to increase frequency modulation efficiency. However, using electron stagnation with intensity modulation can cause deterioration (roll-off) of electrical/optical response characteristics at low frequencies.

SUMMARY

According to some possible implementations, an optical semiconductor device may include: a multi-quantum well layer including some well layers and some barrier layers alternately overlapping with each other, wherein each of the barrier layers is an undoped layer, wherein an outermost layer is one of the barrier layers; an optical confinement layer that has a refractive index that is greater than that of the outermost layer, wherein the optical confinement layer has a band gap that is smaller than that of the outermost layer; and a guide layer interposed between the multi-quantum well layer and the optical confinement layer, wherein the guide layer includes a first adjacent layer in contact with the outermost layer and the guide layer is thinner than the optical confinement layer. Each of the optical confinement layer and the guide layer is an n-type semiconductor layer. The first adjacent layer of the guide layer has a band gap that is larger than that of the optical confinement layer.

Light may be confined in the optical confinement layer, eventually increasing an optical confinement factor to the multi-quantum well layer. Further, the guide layer may lower an energy barrier between the undoped layer and the n-type semiconductor layer, suppressing electron stagnation. Accordingly, improvements in the f3 dB bandwidth with reduction of roll-of may be achieved.

DETAILED DESCRIPTION

Figure 1:
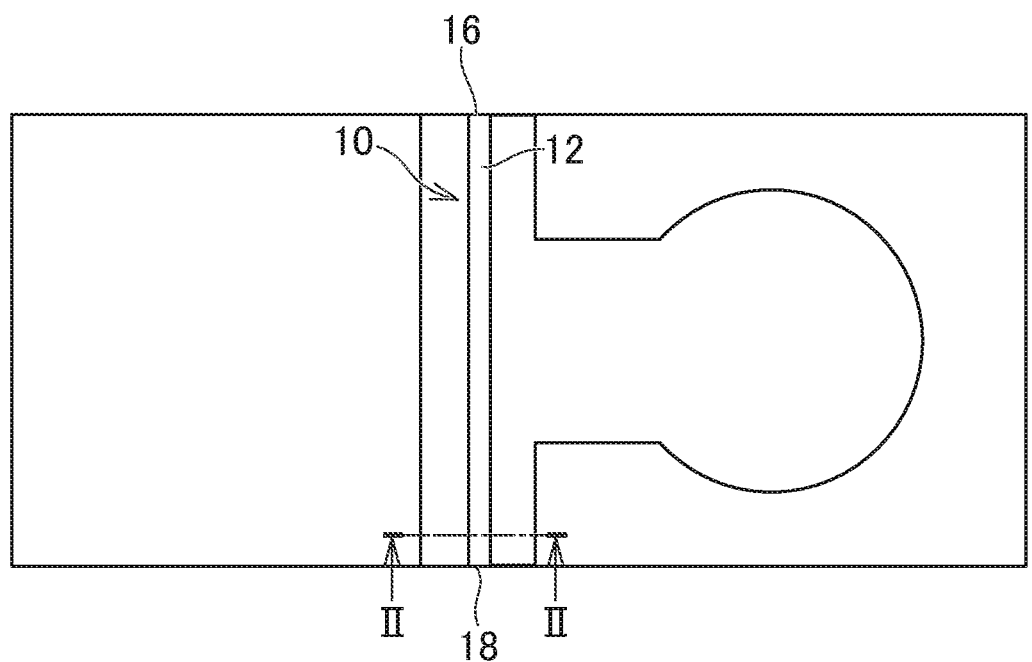
FIG. 1 is a plan view of an example optical semiconductor device described herein.

Hereinafter, some implementations are described specifically and in detail with reference to drawings. In all the drawings, the members with the same reference numerals have the identical or same feature and their repetitive description will be omitted. Sizes of figures do not always comply with magnification.

Figure 2:
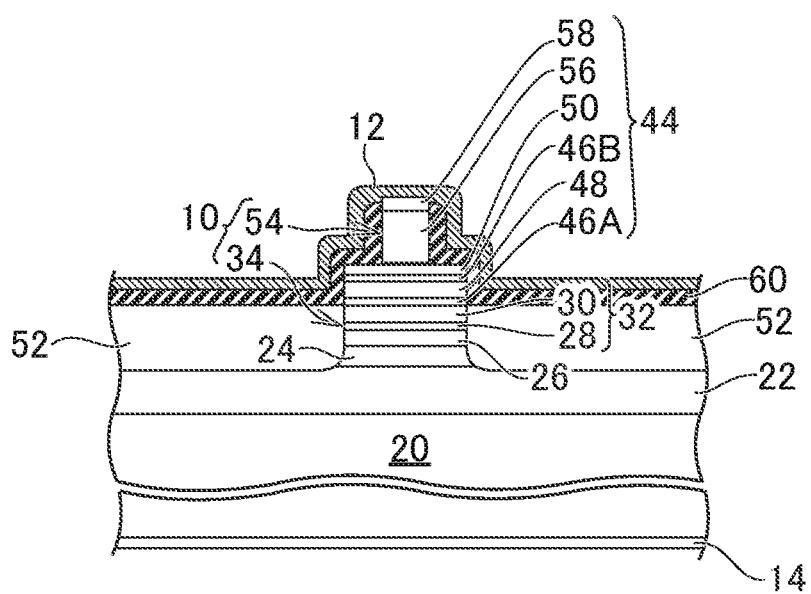
FIG. 2 is a II-II cross-sectional view of the example optical semiconductor device shown in FIG. 1.

FIG. 1 is a plan view of an example optical semiconductor device. FIG. 2 is a II-II cross-sectional view of the example optical semiconductor device shown in FIG. 1.

The example optical semiconductor device may be a direct modulation-type semiconductor laser and may be any one of a distributed feedback (DFB) laser, a Fabry-Perot (FP) laser, a distributed bragg reflector (DBR) laser, or a distributed reflector (DR) laser.

The example optical semiconductor device may have a mesa stripe structure 10. The example optical semiconductor device may have an upper electrode 12 and a lower electrode 14 on an upper surface and a lower surface of the example optical semiconductor device, respectively, to apply a voltage or inject a current between the electrodes. This enables oscillation of laser light in a 1.3 micrometer ($\mu$m) band or a 1.55 $\mu$m band, for example, from an end surface of the mesa stripe structure 10. A dielectric anti-reflection coating film 16 may be formed on the end surface on an emission side of the mesa stripe structure 10. A dielectric highly reflective coating film 18 may formed on an opposite end surface of the mesa stripe structure 10.

The example optical semiconductor device may include a semiconductor substrate 20 comprising p-type InP. A buffer layer 22 (e.g., a p-type cladding layer) may comprise p-type InP and may be laminated on the semiconductor substrate 20. The mesa stripe structure 10 may be disposed on the buffer layer 22.

The mesa stripe structure 10 may include a p-type SCH layer 24, a multi-quantum well layer 26, a guide layer 28, and an optical confinement layer 30, in order of proximity to the buffer layer 22. The guide layer 28 and the optical confinement layer 30 can also be referred to as an n-type SCH layer 32. These layers form part of a lower mesa structure 34 of the mesa stripe structure 10.

The example optical semiconductor device may have a structure where an undoped multi-quantum well layer 26 is interposed between a p-type semiconductor multilayer and an n-type semiconductor multilayer. Another undoped layer may be interposed between the p-type semiconductor multilayer and the multi-quantum well layer 26.

Figure 3:
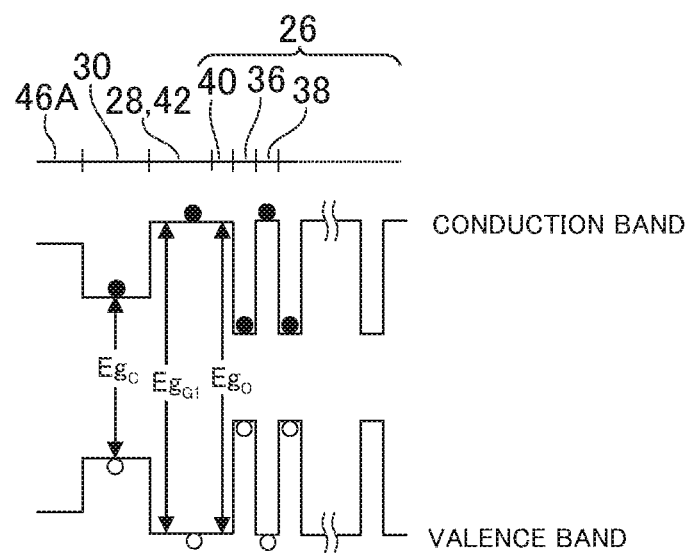
FIG. 3 is a band diagram of a multi-quantum well layer, a guide layer, and an optical confinement layer in an example implementation.

FIG. 3 is a band diagram of a multi-quantum well layer 26, a guide layer 28, and an optical confinement layer 30 in an example implementation. A band gap is an energy difference between a top of a valence band and a bottom of a conduction band.

The multi-quantum well layer 26 may comprise undoped strain InGaAlAs. The multi-quantum well layer 26 may include some well layers 36 and some barrier layers 38 (e.g., six pairs of well layers 36 and barrier layers 38) that are alternately laminated. A well layer 36 and a barrier layer 38 may have the same thickness (e.g., 8 nm). Each barrier layer 38 may be an undoped layer. An outermost layer 40 (each of a top layer and a bottom layer) of the multi-quantum well layer 26 may be one of the barrier layers 38.

The optical confinement layer 30 may be an n-type semiconductor layer (e.g., an n-type InGaAlAs layer, with a thickness of 80 nm and/or with a composition wavelength of 1.15 μm). Si may be used as an n-type dopant.

The guide layer 28 may be an n-type semiconductor layer (e.g., an n-type InGaAlAs layer, with a thickness of 40 nm and/or with a composition wavelength of 0.93 μm). Si may be used as an n-type dopant. A doping concentration of the guide layer 28 and a doping concentration of the optical confinement layer 30 may be the same or different. A concentration difference should be appropriate to sufficiently apply an electric field. The guide layer 28 may be interposed between the multi-quantum well layer 26 and the optical confinement layer 30. The guide layer 28 may include a first adjacent layer 42 in contact with the outermost layer 40 of the multi-quantum well layer 26. In some implementations, the guide layer 28 may comprise only the first adjacent layer 42. The guide layer 28 (e.g., comprising only the first adjacent layer 42) may have a same composition wavelength as that of the outermost layer 40 of the multi-quantum well layer 26.

As shown in FIG. 3, a band gap $Eg_{G1}$ of the first adjacent layer 42 is larger than the band gap $Eg_C$ of the optical confinement layer 30. Therefore, there is an energy barrier (a difference in energy level in the conduction band) between the guide layer 28 and the optical confinement layer 30, but resulting electron stagnation is small, as compared to electron stagnation resulting from an energy barrier between an n-type semiconductor layer and an undoped layer, since the guide layer 28 and the optical confinement layer 30 are n-type semiconductor layers. This is because, when an electric field is sufficiently applied in an n-type layer, electrons move smoothly between the guide layer 28 and the optical confinement layer 30 due to less stagnation of electrons by the energy barrier. This reduces a likelihood of roll-off at low frequencies of electrical and/or optical response characteristics. In some implementations, the band gap $Eg_{G1}$ of the first adjacent layer 42 may be equal to the band gap $Eg_O$ of the outermost layer 40 of the multi-quantum well layer 26, and therefore no energy barrier is formed.

Light generated in a multi-quantum well layer (e.g., the multi-quantum well layer 26) may spread not only to the multi-quantum well layer, but also to upper and lower layer sides thereof (e.g., a p-type semiconductor multilayer side and/or an n-type semiconductor multilayer side). A region where the light is contained is a region defined by a p-type optical confinement layer, the multi-quantum well layer, and an n-type optical confinement layer. An optical confinement layer may be configured to suppress light from spreading to other regions. In some implementations, a refractive index of the optical confinement layer is less than a refractive index of an outermost layer (e.g., a barrier layer) of the multi-quantum well layer. This may improve the flow of carriers. Typically, the greater the refractive index of the optical confinement layer becomes, the smaller the band gap of the optical confinement layer becomes. In some implementations, the optical confinement layer has a larger band gap than that of the barrier layer, which prevents formation of an energy barrier in the movement of the carriers, such as electrons.

As shown in FIG. 3, the band gap $Eg_C$ of the optical confinement layer 30 may be smaller than the band gap $Eg_O$ of the outermost layer 40 of the multi-quantum well layer 26. In an InGaAlAs layer, the larger a band gap becomes, the smaller the refractive index becomes. Thus, the refractive index $n_C$ of the optical confinement layer 30 may be greater than the refractive index $n_O$ of the outermost layer 40 of the multi-quantum well layer 26. Therefore, as compared to a structure where the refractive index of the optical confinement layer 30 is smaller than the refractive index of the outermost layer 40 of the multi-quantum well layer 26, it is possible to increase the optical confinement factor of the region of the multi-quantum well layer 26 as compared to that of the optical confinement layer 30. This enables an increase in the optical confinement factor of the multi-quantum well layer 26 and therefore enables improvement of fr or improvement of f3 dB bandwidth as a total.

Further, as described above, the guide layer 28 may reduce an impact of the energy barrier, which is between the optical confinement layer 30 and the outermost layer 40 of the multi-quantum well layer 26, on the flow of electrons. Therefore, electron stagnation is suppressed and roll-off is reduced. In some implementations, the refractive index $n_{G1}$ of the first adjacent layer 42 is equal to the refractive index $n_O$ of the outermost layer 40 of the multi-quantum well layer 26. The refractive index $n_C$ of the optical confinement layer 30 is greater than the refractive index $n_{G1}$ of the guide layer 28 (first adjacent layer 42). A strain amount (e.g., that includes no strain) of the first adjacent layer 42 and a strain amount of the outermost layer 40 may be different, thereby slightly differentiating their respective finished composition wavelengths (band gaps). However, the respective composition wavelengths may be substantially the same, such that a difference between the composition wavelengths does not substantially affect the roll-off characteristics or the optical confinement factor.

In some implementations, the guide layer 28 (first adjacent layer 42) may contact the optical confinement layer 30. The guide layer 28 (first adjacent layer 42) may be thinner than the optical confinement layer 30 to confine light within the multi-quantum well layer 26.

As shown in FIG. 2, the lower mesa structure 34 may include an n-type cladding layer 44 adjacent to the optical confinement layer 30. The n-type cladding layer 44 may include a first n-type InP layer 46A, a diffraction grating layer 48 that comprises n-type InGaAsP, a second n-type InP layer 46B, and an n-type InGaAsP layer 50. The diffraction grating layer 48 may have a periodic diffraction grating structure such as a λ/4 shift structure in a direction that is perpendicular to the cross-sectional view of the example optical semiconductor device shown in FIG. 2.

A buried layer 52 of p-type InP may fill the lower mesa structure 34 (at least part thereof) on both sides. The buried layer 52 may comprise high resistance InP that uses Fe or Ru as a dopant, or may be a laminate of materials selected from a group consisting of p-type InP, n-type InP, and high resistance InP.

The mesa stripe structure 10 may include an upper mesa structure 54 on the lower mesa structure 34. The upper mesa structure 54 may be narrower than the lower mesa structure 34. The upper mesa structure 54 may include a current injection layer 56 that comprises n-type InP and an n-type contact layer 58, in order of proximity to the n-type InGaAsP layer 50. The current injection layer 56 may be part of the n-type cladding layer 44. The surface of the upper mesa structure 54, except at its top, may be covered with an insulating layer 60 that comprises $SiO_2$. The upper electrode 12 may be electrically and physically connected to the n-type contact layer 58. The upper electrode 12 may have a three-layer structure of Ti/Pt/Au that is in contact, from the side, with the n-type contact layer 58. The lower electrode 14 may comprise AuZn based materials.

Figure 4:
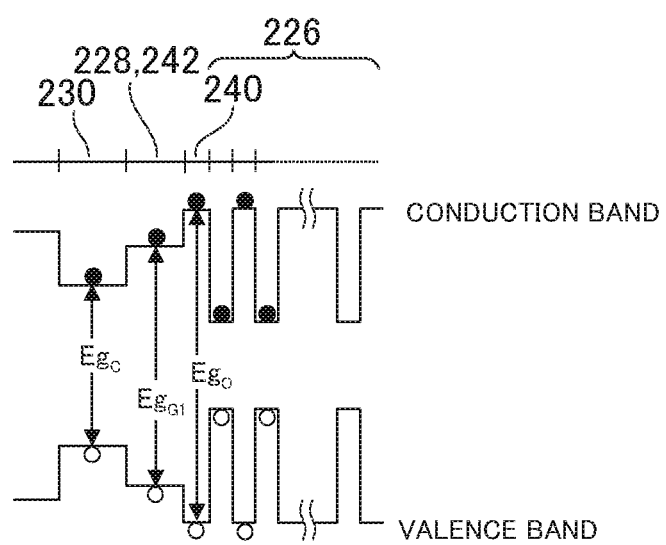
FIG. 4 is a band diagram of a multi-quantum well layer, a guide layer, and an optical confinement layer in an example implementation.

FIG. 4 is a band diagram of a multi-quantum well layer, a guide layer, and an optical confinement layer in an example implementation.

A guide layer 228 may comprise only a first adjacent layer 242. The band gap $Eg_{G1}$ of the guide layer 228 (first adjacent layer 242) may be larger than the band gap $Eg_C$ of an optical confinement layer 230. The band gap $Eg_{G1}$ of the first adjacent layer 242 of the guide layer 228 may be smaller than the band gap $Eg_0$ of an outermost layer 240 of a multi-quantum well layer 226. Therefore, there may be a difference in energy level in the conduction band, between the guide layer 228 (first adjacent layer 242) and the outermost layer 240 of the multi-quantum well layer 226. However, this difference may be smaller than a difference in energy level between the optical confinement layer 230 and the outermost layer 240 of the multi-quantum well layer 226. Accordingly, the guide layer 228 (first adjacent layer 242) reduces electron stagnation.

In the energy level of the conduction band, the difference between the first adjacent layer 242 and the outermost layer 240 may be less than half (e.g., less than one third) of the difference between the optical confinement layer 230 and the outermost layer 240. This can effectively reduce roll-off. In some implementations, a relationship of the refractive index $n_C$ of the optical confinement layer 230, the refractive index $n_{G1}$ of the guide layer 228 (first adjacent layer 242), and the refractive index $n_0$ of the outermost layer 240 of the multi-quantum well layer 226 is as shown in FIG. 4.

Figure 5:
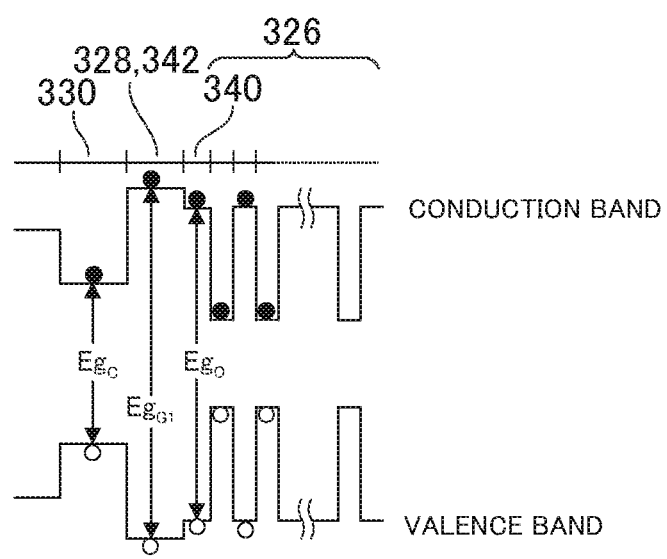
FIG. 5 is band diagram of a multi-quantum well layer, a guide layer, and an optical confinement layer in an example implementation.

FIG. 5 is band diagram of a multi-quantum well layer, a guide layer, and an optical confinement layer in an example implementation.

A guide layer 328 may comprise only a first adjacent layer 342. The band gap $Eg_{G1}$ of the guide layer 328 (first adjacent layer 342) may be larger than the band gap $Eg_0$ of an outermost layer 340 of a multi-quantum well layer 326. This reduces electron stagnation, and thereby reduces roll-off. When a difference in energy level between the guide layer 328 (first adjacent layer 342) and an optical confinement layer 330 is large, electron stagnation may occur, even when they are the same n-type semiconductor layers. Therefore, in the energy level of the conduction band, a difference between the first adjacent layer 342 and the optical confinement layer 330 may be 0.6 eV or less. In some implementations, a relationship between the refractive index $n_C$ of the optical confinement layer 330, the refractive index $n_{G1}$ of the guide layer 328 (first adjacent layer 342), and the refractive index $n_O$ of the outermost layer 340 of the multi-quantum well layer 326 is as shown in FIG. 5.

Figure 6:
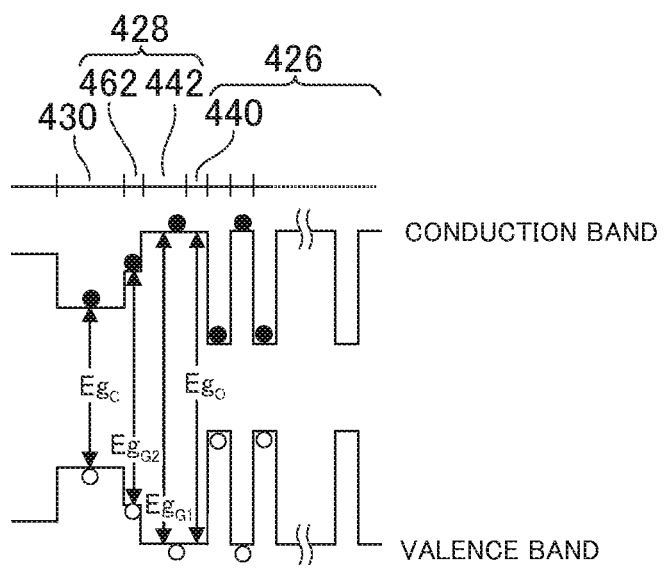
FIG. 6 is a band diagram of a multi-quantum well layer, a guide layer, and an optical confinement layer in an example implementation.

FIG. 6 is a band diagram of a multi-quantum well layer, a guide layer, and an optical confinement layer in an example implementation.

A guide layer 428 may comprise multiple layers. The layers may include a first adjacent layer 442 in contact with an outermost layer 440. The layers may include a second adjacent layer 462 in contact with an optical confinement layer 430. The second adjacent layer 462 and the first adjacent layer 442 may be doped with Si of the same concentration. A thickness of the guide layer 428 (the total thickness of the first adjacent layer 442 and the second adjacent layer 462) may be less than a thickness of the optical confinement layer 430.

The band gap $Eg_{G1}$ of the first adjacent layer 442 of the guide layer 428 may be equal to the band gap $Eg_0$ of the outermost layer 440 of a multi-quantum well layer 426. This reduces electron stagnation between the n-type semiconductor layer and the undoped layer.

The band gap $Eg_{G2}$ of the second adjacent layer 462 may be larger than the band gap $Eg_C$ of the optical confinement layer 430. The band gap $Eg_{G2}$ of the second adjacent layer 462 may be smaller than the band gap $Eg_0$ of the outermost layer 440 of the multi-quantum well layer 426. The band gap $Eg_{G2}$ of the second adjacent layer 462 may be smaller than the band gap $Eg_{G1}$ of the first adjacent layer 442. This reduces electron stagnation because energy level changes are stepwise in the guide layer 428 (first adjacent layer 442 and second adjacent layer 462). Also, in some implementations, the optical confinement layer 430 may increase an optical confinement factor for the multi-quantum well layer 426. in some implementations, a relationship between the refractive index $n_C$ of the optical confinement layer 430, the refractive index $n_{G1}$ of the first adjacent layer 442, and the refractive index $n_0$ of the outermost layer 440 of the multi-quantum well layer 426 is as shown in FIG. 6.

Figure 7:
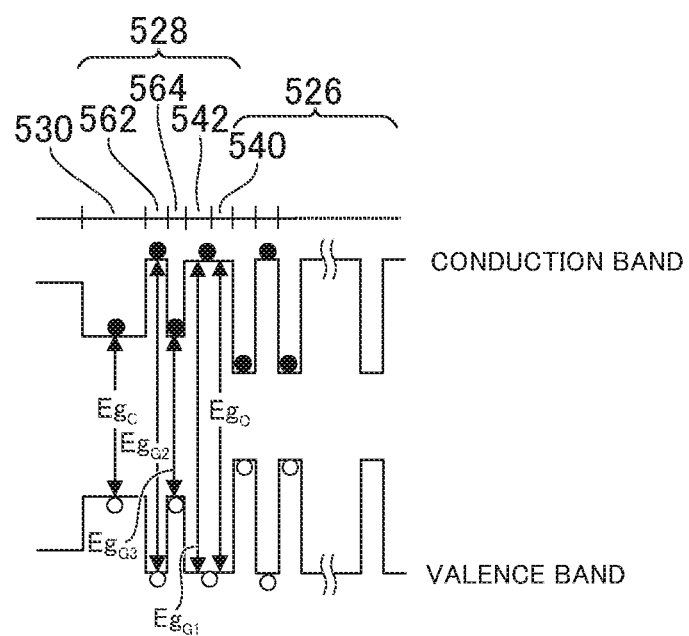
FIG. 7 is a band diagram of a multi-quantum well layer, a guide layer, and an optical confinement layer in an example implementation.

FIG. 7 is a band diagram of a multi-quantum well layer, a guide layer, and an optical confinement layer in an example implementation.

A guide layer 528 may comprise multiple layers. The layers may include a first adjacent layer 542 in contact with an outermost layer 540 of a multi-quantum well layer 526. The layers may include a second adjacent layer 562 in contact with an optical confinement layer 530. The layers may include at least one intermediate layer 564 between the first adjacent layer 542 and the second adjacent layer 562. The second adjacent layer 562 and the intermediate layer 564 may be doped with Si, having the same concentration as the first adjacent layer 542.

The band gap $Eg_{G1}$ of the first adjacent layer 542 may be equal to the band gap $Eg_0$ of the outermost layer 540 of the multi-quantum well layer 526. The band gap $Eg_{G2}$ of the second adjacent layer 562 may be larger than the band gap $Eg_C$ of the optical confinement layer 530. The band gap $Eg_{G2}$ of the second adjacent layer 562 may be equal to the band gap $Eg_0$ of the outermost layer 540 of the multi-quantum well layer 526. The band gap $Eg_{G2}$ of the second adjacent layer 562 may be equal to the band gap $Eg_{G1}$ of the first adjacent layer 542. The band gap $Eg_{G3}$ of the intermediate layer 564 may be equal to the band gap $Eg_C$ of the optical confinement layer 530.

A thickness of the guide layer 528 may less than half a thickness of the multi-quantum well layer 526. When the thickness of the guide layer 528 is more than half the thickness of the multi-quantum well layer 526, an optical confinement effect may not be sufficient. A thickness of the optical confinement layer 530 may be more than half the thickness of the multi-quantum well layer 526. Otherwise, the optical confinement layer 530, may not sufficiently confine the light to the multi-quantum well layer 526.

A thickness of the intermediate layer 564 may be less than that of the first adjacent layer 542, which may not increase the effect of the confinement of the light to the multi-quantum well layer 526. However, the optical confinement layer 530, across from the second adjacent layer 562, enables confinement of the light to the multi-quantum well layer 526, as a whole. Therefore, a confinement effect is obtained, when another layer is interposed between the first adjacent layer 542 and the optical confinement layer 530. In some implementations, a relationship between the refractive index $n_C$ of the optical confinement layer 530, the refractive index $n_{G1}$ of the first adjacent layer 542, the refractive index $n_{G2}$ of the second adjacent layer 562, the refractive index $n_{G3}$ of the intermediate layer 564, and the refractive index $n_0$ of the outermost layer 540 of the multi-quantum well layer 526 is shown in FIG. 7.

Figure 8:
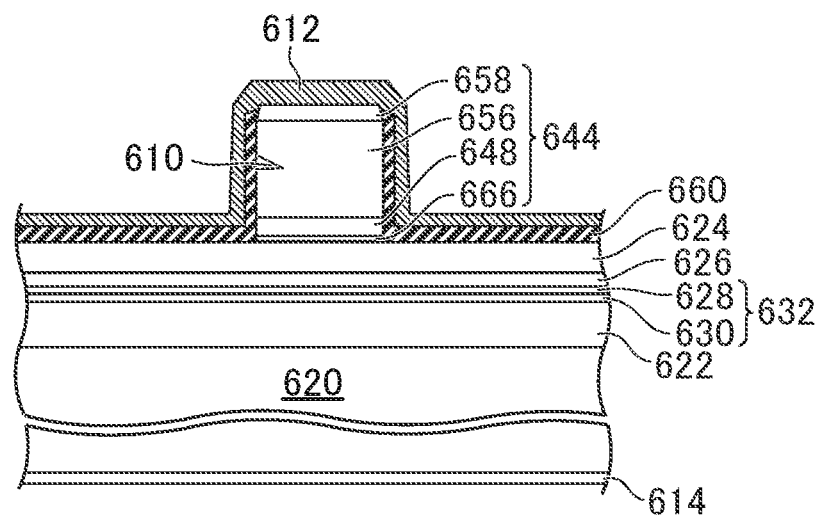
FIG. 8 is a cross-sectional view of an example optical semiconductor device described herein.

FIG. 8 is a cross-sectional view of an example optical semiconductor device. The optical semiconductor device may have a semiconductor substrate 620 comprising n-type InP. A buffer layer 622 comprising n-type InP (e.g., an n-type cladding layer) may be laminated on the semiconductor substrate 620. An optical confinement layer 630, a guide layer 628, a multi-quantum well layer 626, a p-type SCH layer 624, and a p-type cladding layer 644 may be laminated on the buffer layer 622, in order of proximity to the buffer layer 622. The optical confinement layer 630 and the guide layer 628 may be referred to as an n-type SCH layer 632.

Figure 9:
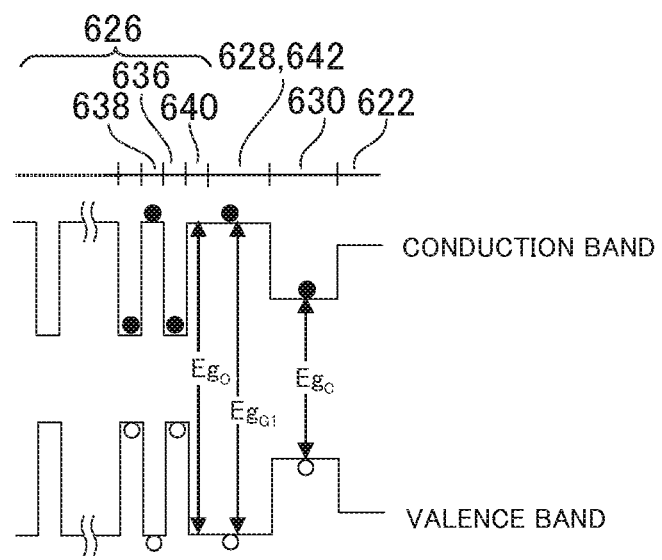
FIG. 9 is a band diagram of a multi-quantum well layer, a guide layer, and an optical confinement layer in an example implementation.

FIG. 9 is a band diagram of a multi-quantum well layer, a guide layer, and an optical confinement layer in an example implementation.

The multi-quantum well layer 626 may comprise undoped strain InGaAlAs. The multi-quantum well layer 626 may include some well layers 636 and some barrier layers 638 (e.g., six pairs of well layers 636 and barrier layers 638) that are alternately laminated. A well layer 636 and a barrier layer 638 may have the same thickness (e.g., 8 nm). Each of the barrier layers 638 may be an undoped layer. An outermost layer 640 (each of a top layer and a bottom layer) of the multi-quantum well layer 626 may be one of the barrier layers 638.

The guide layer 628 may be an n-type semiconductor layer (e.g., an n-type InGaAlAs layer with a thickness of 40 nm and/or with a composition wavelength of 0.93 μm). Si may be used as an n-type dopant. A doping concentration of the guide layer 628 and a doping concentration of the optical confinement layer 630 may be the same or different. A concentration difference should be appropriate to sufficiently apply an electric field. The guide layer 628 may be interposed between the multi-quantum well layer 626 and the optical confinement layer 630. The guide layer 628 may include a first adjacent layer 642 in contact with the outermost layer 640 of the multi-quantum well layer 626. In some implementations, the guide layer 628 may comprise only the first adjacent layer 642. The guide layer 628 (first adjacent layer 642) may have a same composition wavelength as the outermost layer 640 of the multi-quantum well layer 626.

The band gap $Eg_{G1}$ of the first adjacent layer 642 may be larger than the band gap $Eg_C$ of the optical confinement layer 630. Therefore, there is an energy barrier (a difference in energy level in the conduction band) between the guide layer 628 and the optical confinement layer 630, but resulting electron stagnation is small, as compared to electron stagnation resulting from an energy barrier between an n-type semiconductor layer and an undoped layer, since the guide layer 628 and the optical confinement layer 630 are n-type semiconductor layers. This is because, when an electric field is sufficiently applied in an n-type layer, electrons move smoothly between the guide layer 628 and the optical confinement layer 630, due to less stagnation of electrons by the energy barrier. This reduces a likelihood of roll-off at low frequencies of the electrical and/or optical response characteristics. in some implementations, the band gap $Eg_{G1}$ of the first adjacent layer 642 may be equal to the band gap $Eg_0$ of the outermost layer 640 of the multi-quantum well layer 626, and therefore no energy barrier is formed.

The optical confinement layer 630 may be an n-type semiconductor layer (e.g., an n-type InGaAlAs layer with a thickness of 80 nm and/or with a composition wavelength of 1.15 μm). Si may be used as an n-type dopant.

The band gap $Eg_C$ of the optical confinement layer 630 may be smaller than the band gap $Eg_0$ of the outermost layer 640 of the multi-quantum well layer 626. In an InGaAlAs layer, the larger a band gap becomes, the smaller the refractive index becomes. Thus, the refractive index $n_C$ of the optical confinement layer 630 may be greater than the refractive index $n_0$ of the outermost layer 640 of the multi-quantum well layer 626. As described above, this may increase an optical confinement factor of the multi-quantum well layer 626, which may enable improvement of fr or improvement of f3 dB bandwidth as a total.

In some implementations, the refractive index $n_{G1}$ of the first adjacent layer 642 may be equal to the refractive index $n_0$ of the outermost layer 640 of the multi-quantum well layer 626. The refractive index $n_0$ of the optical confinement layer 630 may be greater than the refractive index $n_{G1}$ of the guide layer 628 (first adjacent layer 642).

The guide layer 628 (first adjacent layer 642) may contact the optical confinement layer 630. The guide layer 628 (first adjacent layer 642) may be thinner than the optical confinement layer 630 to confine light to the multi-quantum well layer 626.

As shown in FIG. 8, the p-type cladding layer 644 includes a p-type InP layer 666, a diffraction grating layer 648 comprising p-type InGaAsP, a current injection layer 656 comprising p-type InP, and a p-type contact layer 658, in order of proximity to the p-type SCH layer 624. The diffraction grating layer 648 may have a periodic diffraction grating structure such as a λ/4 shift structure in a direction that is perpendicular to the cross-sectional view of the example optical semiconductor device shown in FIG. 8.

A laminate from the p-type InP layer 666 to the p-type contact layer 658 may be included in the mesa stripe structure 610. The insulating layer 660 comprising $SiO_2$ may be disposed extending from a side surface of the mesa stripe structure 610 to an upper surface of the p-type SCH layer 624.

An upper electrode 612 may be electrically and physically connected to a p-type contact layer 658. An upper electrode 612 may have a three-layer structure of Ti/Pt/Au that is in contact, from the side, with the p-type contact layer 658. The lower electrode 614 may comprise AuZn based materials.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An optical semiconductor device comprising:
a lower mesa structure;
an upper mesa structure on the lower mesa structure, wherein the upper mesa structure is narrower than the lower mesa structure;
a multi-quantum well layer included in the lower mesa structure, the multi-quantum well layer including some well layers and some barrier layers alternately overlapping with each other,
wherein each of the barrier layers is an undoped layer, wherein an outermost layer is one of the barrier layers;
an optical confinement layer that is included in the lower mesa structure and has a refractive index that is greater than a refractive index of the outermost layer,
wherein the optical confinement layer has a band gap that is smaller than a band gap of the outermost layer;
an InGaAlAs guide layer interposed between the multi-quantum well layer and the optical confinement layer,
wherein the guide layer directly contacts the optical confinement layer, and
wherein the guide layer includes a first adjacent layer in contact with the outermost layer and the guide layer is thinner than the optical confinement layer,
wherein:
each of the optical confinement layer and the guide layer is an n-type semiconductor layer, and
the first adjacent layer of the guide layer has a band gap that is larger than a band gap of the optical confinement layer; and
an InP buried layer surrounding the lower mesa structure.

2. The optical semiconductor device of claim 1, wherein the band gap of the first adjacent layer of the guide layer is equal to the band gap of the outermost layer of the multi-quantum well layer.

3. The optical semiconductor device of claim 1, wherein the band gap of the first adjacent layer of the guide layer is smaller than the band gap of the outermost layer of the multi-quantum well layer.

4. The optical semiconductor device of claim 1, wherein the band gap of the first adjacent layer of the guide layer is larger than the band gap of the outermost layer of the multi-quantum well layer.

5. The optical semiconductor device of claim 1, wherein the guide layer comprises only the first adjacent layer.

6. The optical semiconductor device of claim 1, wherein:
the guide layer comprises the first adjacent layer in contact with the outermost layer and a second adjacent layer in contact with the optical confinement layer, and
the second adjacent layer has a band gap that is larger than the band gap of the optical confinement layer.

7. The optical semiconductor device of claim 6, wherein the guide layer further comprises at least one intermediate layer between the first adjacent layer and the second adjacent layer.

8. The optical semiconductor device of claim 1, wherein in a conduction band, a difference in energy level between the first adjacent layer and the outermost layer is half or less of a difference in energy level between the optical confinement layer and the outermost layer.

9. The optical semiconductor device of claim 1, wherein in a conduction band, a difference in energy level between the first adjacent layer and the outermost layer is one third or less of a difference in energy level between the optical confinement layer and the outermost layer.

10. The optical semiconductor device of claim 1, wherein in a conduction band, a difference in energy level between the first adjacent layer and the optical confinement layer is 0.6 eV or less.

11. The optical semiconductor device of claim 1, wherein a thickness of the guide layer is half or less of a thickness of the multi-quantum well layer.

12. The optical semiconductor device of claim 1, wherein a thickness of the optical confinement layer is half or more of a thickness of the multi-quantum well layer.

13. The optical semiconductor device of claim 1, further comprising:

a p-type separate confinement heterostructure layer arranged adjacent to the multi-quantum well layer and opposite the guide layer.

14. The optical semiconductor device of claim 1, wherein the InP buried layer comprises at least one of:
   InP doped with Fe or Ru, or
   a laminate of materials that comprises at least one of:
   p-type InP,
   n-type InP, or
   high resistance InP.

15. An optical semiconductor device comprising:
   a lower mesa structure;
   an upper mesa structure on the lower mesa structure, wherein the upper mesa structure is narrower than the lower mesa structure;
   a multi-quantum well layer included in the lower mesa structure, the multi-quantum well layer including some well layers and some barrier layers alternately overlapping with each other,
      wherein each of the barrier layers is an undoped layer, and
      wherein an outermost layer is one of the barrier layers;
   an optical confinement layer that is included in the lower mesa structure and has a refractive index that is greater than a refractive index of the outermost layer,
      wherein the optical confinement layer has a band gap that is smaller than a band gap of the outermost layer;
   an InGaAlAs guide layer interposed between the multi-quantum well layer and the optical confinement layer,
      wherein the guide layer directly contacts the optical confinement layer,
      wherein the guide layer includes a first adjacent layer in contact with the outermost layer and the guide layer is thinner than the optical confinement layer, and
      wherein the first adjacent layer of the guide layer has a band gap that is larger than a band gap of the optical confinement layer; and
   an InP buried layer surrounding the lower mesa structure.

16. The optical semiconductor device of claim 15, wherein the band gap of the first adjacent layer of the guide layer is larger than the band gap of the outermost layer of the multi-quantum well layer.

17. The optical semiconductor device of claim 15, wherein the guide layer comprises only the first adjacent layer.

18. The optical semiconductor device of claim 15, wherein in a conduction band, a difference in energy level between the first adjacent layer and the optical confinement layer is 0.6 eV or less.

19. The optical semiconductor device of claim 15, wherein the optical confinement layer and the guide layer are included in an n-type separate confinement heterostructure layer.

20. The optical semiconductor device of claim 15, wherein the InP buried layer comprises at least one of:
   InP doped with Fe or Ru, or
   a laminate of materials that comprises at least one of:
   p-type InP,
   n-type InP, or
   high resistance InP.

21. An optical semiconductor device comprising:
   a lower mesa structure;
   an upper mesa structure on the lower mesa structure, wherein the upper mesa structure is narrower than the lower mesa structure;
   a multi-quantum well layer included in the lower mesa structure, the multi-quantum well layer including some well layers and some barrier layers alternately overlapping with each other,
      wherein each of the barrier layers is an undoped layer, and
      wherein an outermost layer is one of the barrier layers;
   an optical confinement layer that is included in the lower mesa structure and has a refractive index that is greater than a refractive index of the outermost layer,
      wherein the optical confinement layer has a band gap that is smaller than a band gap of the outermost layer;
   an InGaAlAs guide layer interposed between the multi-quantum well layer and the optical confinement layer,
      wherein the guide layer directly contacts the optical confinement layer,
      wherein the guide layer includes a first adjacent layer in contact with the outermost layer and the guide layer is thinner than the optical confinement layer,
      wherein each of the optical confinement layer and the guide layer is an n-type semiconductor layer,
      wherein the first adjacent layer of the guide layer has a band gap that is larger than a band gap of the optical confinement layer, and
      wherein the optical confinement layer and the guide layer are included in an n-type separate confinement heterostructure layer; and
   an InP buried layer surrounding the lower mesa structure.

22. The optical semiconductor device of claim 21, wherein the band gap of the first adjacent layer of the guide layer is larger than the band gap of the outermost layer of the multi-quantum well layer.

23. The optical semiconductor device of claim 21, wherein the guide layer comprises only the first adjacent layer.

24. The optical semiconductor device of claim 21, wherein in a conduction band, a difference in energy level between the first adjacent layer and the optical confinement layer is 0.6 eV or less.

25. The optical semiconductor device of claim 21, wherein the InP buried layer comprises at least one of:
   InP doped with Fe or Ru, or
   a laminate of materials that comprises at least one of:
   p-type InP,
   n-type InP, or
   high resistance InP.

* * * * *